United States Patent
Shiraishi

(10) Patent No.: US 7,415,871 B2
(45) Date of Patent: Aug. 26, 2008

(54) METHOD OF SIMULATING ROLLING TIRE

(75) Inventor: Masaki Shiraishi, Kobe (JP)

(73) Assignee: Sumitomo Rubber Industries, Ltd., Kobe-shi (JP)

( * ) Notice: Subject to any disclaimer, the term of this patent is extended or adjusted under 35 U.S.C. 154(b) by 470 days.

(21) Appl. No.: 11/290,567

(22) Filed: Dec. 1, 2005

(65) Prior Publication Data

US 2006/0136151 A1 Jun. 22, 2006

(30) Foreign Application Priority Data

Dec. 21, 2004 (JP) .............................. 2004-369772

(51) Int. Cl.
*G01M 17/02* (2006.01)
(52) U.S. Cl. ..................................................... 73/146
(58) Field of Classification Search .................. 73/146, 73/146.8, 146.2
See application file for complete search history.

(56) References Cited

U.S. PATENT DOCUMENTS

| | | | |
|---|---|---|---|
| 5,930,155 A | 7/1999 | Tohi et al. | |
| 6,192,745 B1 | 2/2001 | Tang et al. | |
| 6,338,270 B1 | 1/2002 | Mancosu et al. | |
| 6,761,060 B2 * | 7/2004 | Mancosu et al. | 73/146 |
| 7,343,788 B2 * | 3/2008 | Kishida et al. | 73/146 |
| 2001/0020386 A1 * | 9/2001 | Mancosu et al. | 73/146 |
| 2002/0134149 A1 | 9/2002 | Shiraishi et al. | |
| 2003/0055617 A1 * | 3/2003 | Iwasaki et al. | 703/2 |

FOREIGN PATENT DOCUMENTS

| | | |
|---|---|---|
| EP | 0 647 911 A2 | 4/1995 |
| EP | 0 919 941 A2 | 6/1999 |
| EP | 1 014 074 A2 | 6/2000 |
| EP | 1 262 866 A2 | 12/2002 |
| EP | 1 293 917 A2 | 3/2003 |
| EP | 1 473 559 A2 | 11/2004 |

OTHER PUBLICATIONS

Volk H., "Einsatz der Finiten Element Methode bei der Auslegung und Optimierung von Reifen.", *Kautschuk Und Gummi-Kunstoffe*, vol. 47, No. 10, (1994), pp. 739-730, 742.
Ebbott et al., Tire Temperature and Rolling Resistance Prediction with Finite Element Analysis, Tire Science & Technology, Jan.-Mar. 1999, 2-21, 27-1, TSTCA.
Kobayashi et al., Development of Analyzing Technique of Rolling Resistance of Tire, Academic Session Reprint 852074, 379-384, Society of Automotive Engineers of Japan.

* cited by examiner

*Primary Examiner*—Jewel V Thompson
(74) *Attorney, Agent, or Firm*—Birch, Stewart, Kolasch & Birch, LLP

(57) ABSTRACT

A method of simulating rolling tire comprises the steps of: modeling the tire in finite elements to make a tire model which comprises a first element having a viscoelastic property; modeling a road in finite elements to make a road model; executing a numerical simulation in which the tire model is made to roll on the road model at a predetermined condition; obtaining six kinds of strains in time sequence from the first element of the tire model with rolling, the six kinds of strains including three kinds of normal strains along a tire meridian direction, a tire circumferential direction and a tire thickness direction, and three kinds of shear strain along the tire meridian direction, the tire circumferential direction and the tire thickness direction; and calculating energy loss of the first element based on the six kinds of the strains.

6 Claims, 14 Drawing Sheets

Time point A

Time point B

METHOD OF SIMULATING ROLLING TIRE

BACKGROUND OF THE INVENTION

1. Field of the Invention

The present invention relates to a method of simulating rolling tire capable of precisely predicting energy loss.

2. Description of the Related Art

A rolling resistance of a tire largely exerts an influence upon fuel economy of a vehicle, and it is conceived that a contribution rate of the rolling resistance to the fuel economy is about 10%. Thus, in order to improve the fuel performance of a vehicle, it is important to analyze the rolling resistance of a tire. To evaluate the rolling resistance of a tire, it is conventionally necessary to actually prototype a tire and test the tire. However, such a method requires enormous amounts of time, costs and labor. Therefore, it is required to further enhance the developing efficiency.

In "Development of Analyzing Technique of Rolling Resistance of Tire" (the society of automotive engineers of Japan, academic session preprint 852074, written by Youichi KOBAYASI, et al) (document 1, hereinafter), there is described a static analysis for analyzing the rolling resistance by a tire model into contact with a road model without rolling. In this analysis, energy loss of an element of a viscoelastic material of the tire model is calculated using a following equation:

$$U_i \times V_i \times \tan \delta_i$$

wherein $U_i$ represents energy density Ui or the element, $V_i$ represents volume of the element and $\tan \delta_i$ represents loss tangent defined for the element.

Further, in "Tire Science and Technology, TSTCA, vol. 27, No. 1 January-March 1999 P. 22 (Tire Temperature and Rolling Resistance Prediction with Finite Element Analysis) (document 2, hereinafter), there is also described a static analysis of tire model. In this analysis, energy loss per unit volume of the tire model is calculated mainly using "dynamic loss modulus G" and an amplitude of strain.

According to these two methods, the distribution of strain when the tire model is gently brought into contact with a road surface is regarded as the variation of strain received by arbitrary element when the tire rotates once. Therefore, according to the methods described in the two documents, it is necessary to use such a tire model that the cross section shape and material properties of whole elements are uniform in the tire circumferential direction. Thus, if the tire model has a tread portion provided with a lateral groove extending in the axial direction of the tire and the cross section shape of the tire is not continuous in the tire circumferential direction, or if the tire has material properties which are varied in the circumferential direction, precise energy loss can not be calculated by the above methods.

In the document 1, strain energy density is used to calculate the energy loss. If the strain energy density is used, since the direction of deformation of each element of the tire model is not taken into consideration, a logical contradiction arises frequently. As shown in FIG. 14 for example, when strain $\epsilon$ is in an element "e" generated in the direction X at time point A and strain $\epsilon$ is generated in the direction y at next time point B, both strains are the same strain energies and no energy loss is generated according to the strain energy system. In the reality, however, since the direction of deformation is varied, energy loss is generated.

According to the document 2, the amplitude of strain is used to calculate the energy loss. However, this method has a serious problem that since attention is merely paid to the maximum amplitude of strain, when there are two or more peaks in hysteresis of strain as shown in FIG. 7 for example (such a case is generated frequently), the energy loss is calculated smaller than the actual value.

SUMMARY OF THE INVENTION

It is an object of the present invention to provide a method of simulation of tire capable of removing limitations of setting of a tire model, and obtaining a precise simulation result.

According to the present invention, a method of simulating rolling tire comprises the steps of:

modeling the tire in finite elements to make a tire model which comprises at least one first element having a viscoelastic property;

modeling a road in finite elements to make a road model;

executing a numerical simulation in which the tire model is made to roll on the road model at a predetermined condition;

obtaining six kinds of strains in time sequence from the first element of the tire model rolling on the road model, the six kinds of strains including three kinds of normal strains along a tire meridian direction, a tire circumferential direction and a tire thickness direction, and three kinds of shear strain along the tire meridian direction, the tire circumferential direction and the tire thickness direction; and calculating energy loss of the first element based on the six kinds of the strains.

DETAILED DESCRIPTION OF THE PREFERRED EMBODIMENTS

Figure 1:
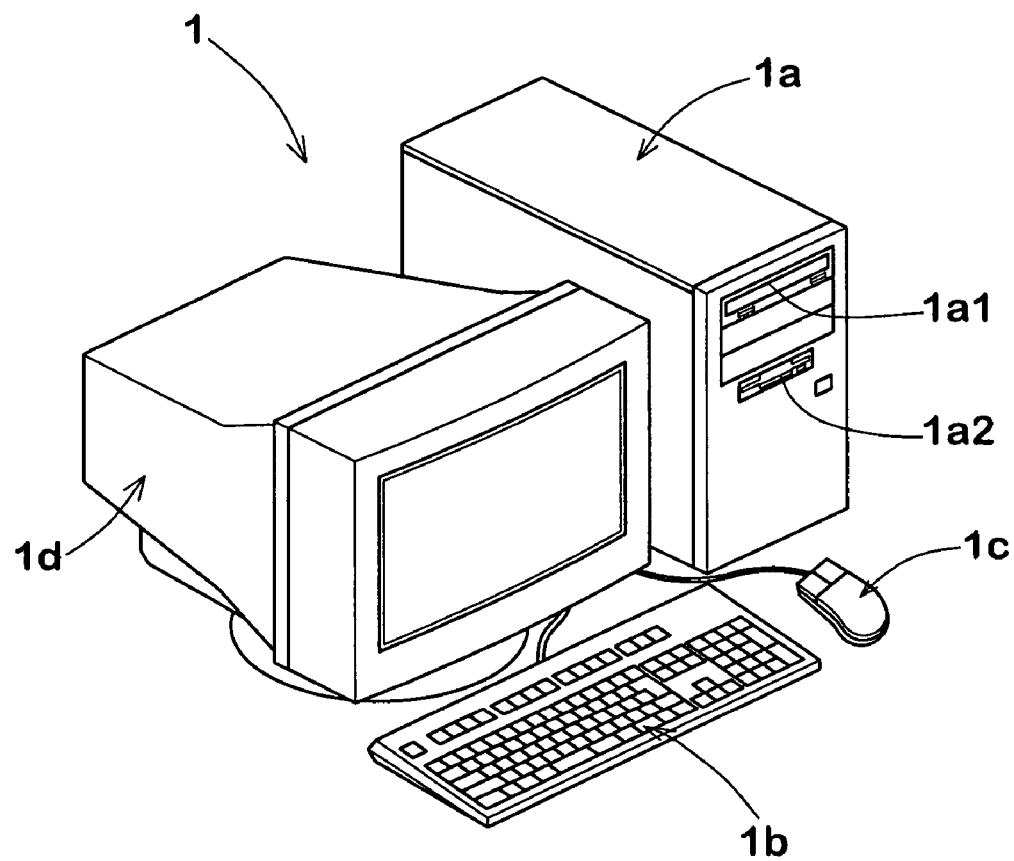
FIG. 1 is a block diagram of a computer apparatus used for carrying out a simulation of the present invention.

A description will be given below of preferred embodiments according to the present invention with reference to the attached drawings. FIG. 1 shows a computer apparatus 1 for carrying out a simulation method according to the present invention. The computer apparatus 1 includes a main unit 1a, a keyboard 1b, and a mouse 1c serving as input means, and a display 1d serving as output means. Although not shown, the main unit 1a is appropriately provided with a central processing unit CPU, a ROM, a working memory RAM, a large-capacity storage device such as a magnetic disk, and disk drives 1a1 and 1a2 for a CD-ROM or a flexible disk. The large-capacity storage device stores therein processing procedures (i.e., programs) for executing a method, described later.

Figure 2:
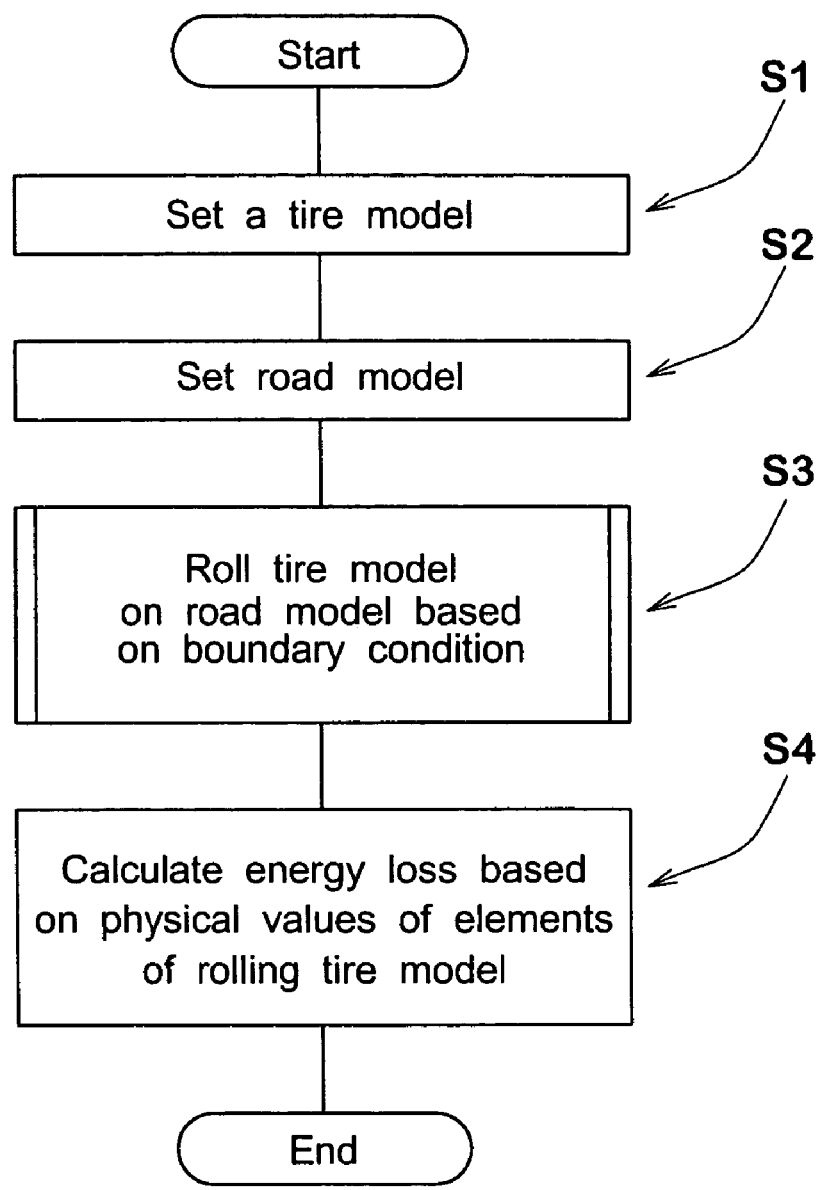
FIG. 2 is a flowchart showing one example of processing procedure of a method of simulation of the invention.

FIG. 2 shows one example of a processing procedure of the simulation method according to the present invention. In FIG. 2, a tire model 2 is first modeled (step S1).

Figure 3:
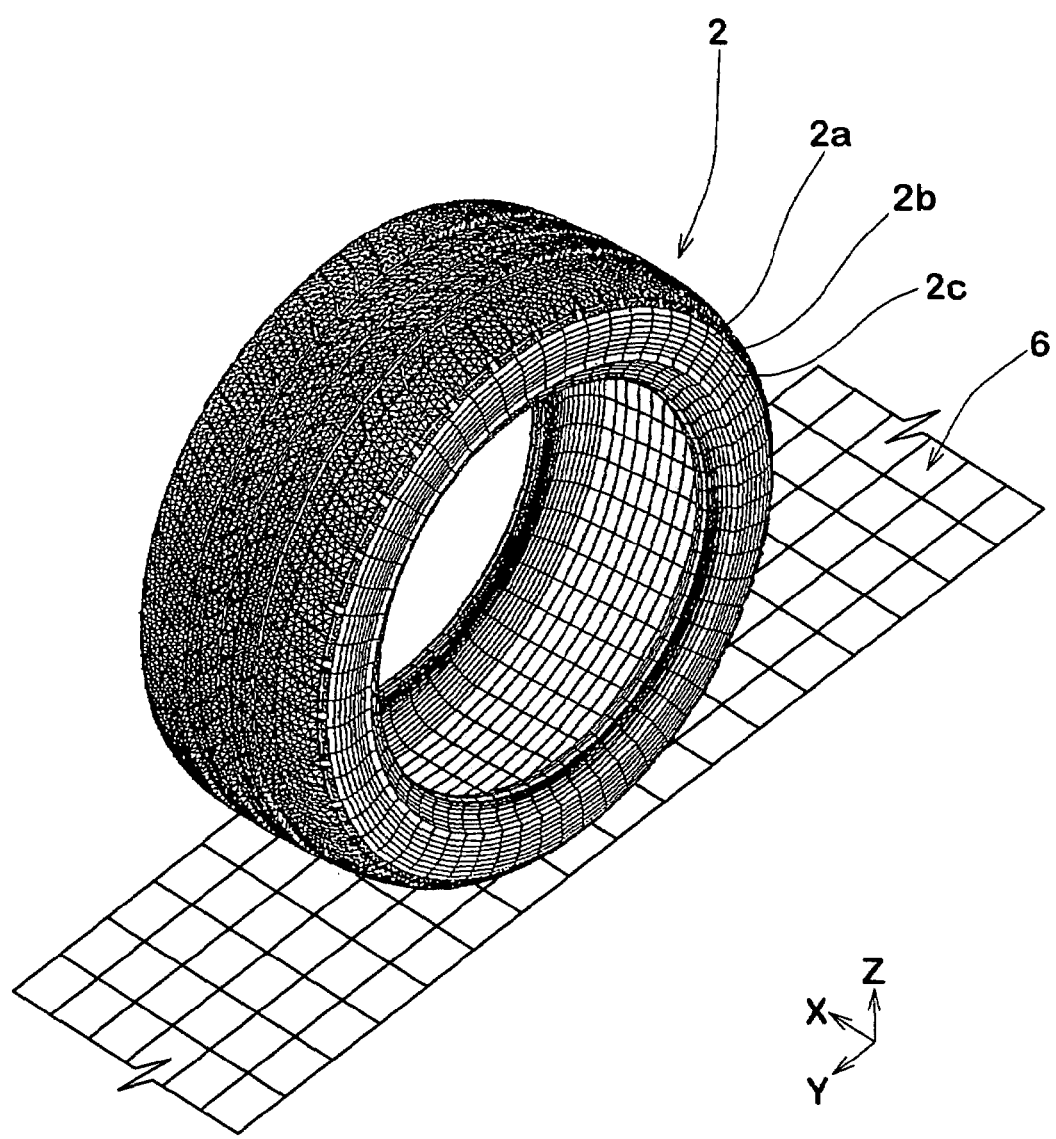
FIG. 3 is a perspective view a tire model and a road model.
Figure 4:
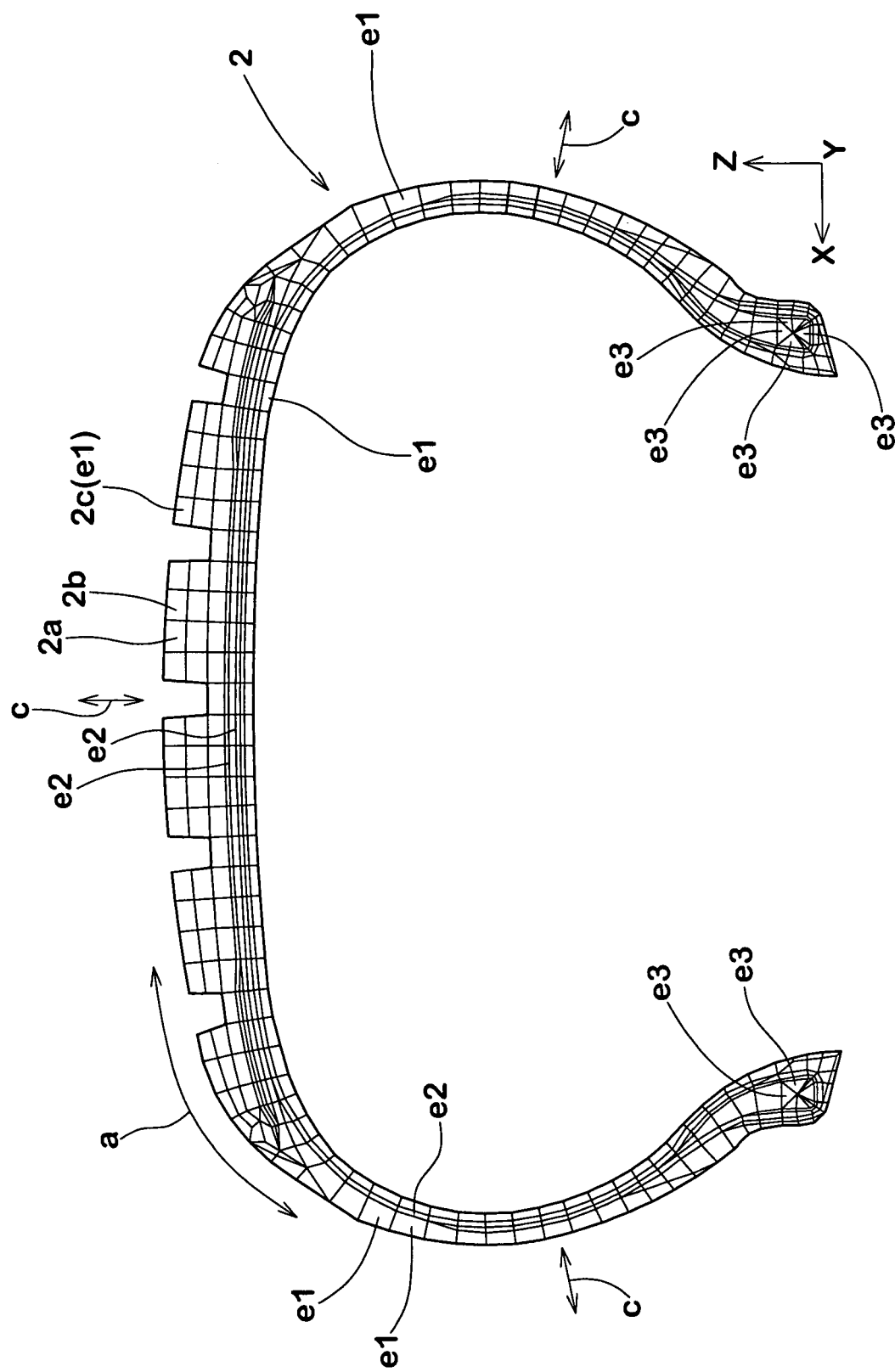
FIG. 4 is a sectional view of the tire model.

FIG. 3 shows one example of the tire model 2 visually in a three-dimensional fashion. FIG. 4 schematically shows a part of a cross section of the tire model 2 including a tire axis.

The tire model 2 is modeled by dividing a tire to be analyzed (irrespective of the actual presence) into the finite elements 2a, 2b, 2c. . . . Each of the elements 2a, 2b, and 2c. . . can be defined in such a manner as to be numerically analyzed. Furthermore, a two-dimensional element or a three-dimensional element is used as each of the elements 2a, 2b, 2c. . . . The two-dimensional elements include, for example, a triangular membrane element and a quadrilateral membrane element. In addition, the three-dimensional elements include, for example, tetrahedral to hexahedral solid elements.

The numeric analysis signifies to freely carry out modification calculation by at least one numerically analyzing method. The numerically analyzing methods include, for example, a finite element method, a finite volume method, calculus of finite differences and a boundary element method. Specifically describing, for example, a coordinate value of a point in a X-Y-Z coordinate system, the shape of the element, the material properties (e.g., a density, a modulus of elasticity, a loss tangent and/or a damping coefficient) and the like are defined with respect to each of the elements 2a, 2b, 2c . . . . Consequently, the substance of the tire model 2 is expressed by numerical data which can be operated in the computer apparatus 1.

A tire model 2 of this embodiment comprises: a first element e1 in which viscoelastic property is defined; a second element e2 in which elasticity properties are defined; and a third element e3 in which rigidity is defined.

The first element e1 is used for a rubber part of a tire such as a tread rubber, a sidewall rubber, a bead rubber, a bead apex rubber and/or inner liner rubber. In the first element e1, stress and strain are not proportional to each other in a deformation calculation, and the first element e1 is handled such that the strain having phase difference is generated with respect to periodical stress. Thus, if the first element e1 is deformed by a simulation, energy loss is generated. In this embodiment, the first element e1 is handled as a superelastic material whose volume is not varied even if the first element e1 is deformed.

The second element e2 is handled such that the strain which is proportional to stress is generated in the deformation calculation, and energy loss is not generated within elasticity limit like the first element e1. The second element e2 is used for fiber material such as a carcass cord or a belt cord of a tire for example.

The third element e3 is handled as a rigid body in which strain is not generated even if an external force is applied in the deformation calculation.

The elements e1 to e3 respectively have suitably defined physical property values. That is, loss tangent, modulus of complex elasticity, storage modulus, damping properties and the like are defined in the first element e1. Elastic modulus (modulus of vertical elasticity, modulus of lateral elasticity) and the like are defined in the second element e2. Anistropy is defined for the cord material based on the arrangement direction of the cord.

As shown in FIGS. 2 and 3, the tread portion of the tire model 2 of the present embodiment is provided with longitudinal grooves extending in the circumferential direction of the tire, and lateral grooves extending in the direction intersecting the circumferential direction of the tire. The tire model 2 includes at least two different cross section shapes each including a tire axis by the lateral grooves. In other words, the cross section shape including the tire axis is not continuous in the circumferential direction of the tire.

In the tire model 2, the cross section shape and the material properties are not continuous in the circumferential direction of the tire. Examples of such cases except one having lateral groove like the present embodiment are as follows:
Presence or absence of sipe and/or tie bar of tread portion
variation of thickness (gage) of each portion
variation of thickness and material caused by a joint portion of rubber material or ply Next, a road model 6 is modeled in the embodiment (step S2). As shown in FIG. 3, the road model 6 of the embodiment includes a flat element having flat rigid surface. The road model 6 may of course have projections and depressions. The road model 6 as such width and length in the circumferential direction of the tire that the tire model 2 can sufficiently come into contact with the ground and roll. Further, the road model 6 may be set prior to the tire model 2.

Each of the tire model 2 and the road model 6 may be formed from the beginning, or one of a plurality of predefined models may be selected, or a portion of an existing model may be modified.

Next, in the embodiment, a rolling simulation is carried out (step S3). In this simulation, the tire model 2 is rolled at least once on a road model 6 based on predefined boundary conditions. The boundary conditions include, for example, rim size, rotation speed, internal pressure, load, friction coefficient between the tire model and the road model, slip angle and/or camber angle. The simulation for rolling the tire model 2 on the road model 6 is carried out based on finite element method using an analyzing program by the computer apparatus 1 for example. An example of the analyzing program is "LS-DYNA" developed by U.S. Livermore software technology Co. Ltd.

As a result of the simulation, physical values such as position, stress and strain of all of elements of the tire model 2 are sequentially calculated and output every very short time. In this invention, in order to calculate precisely energy loss, six kinds of strains are output from each first element e1. At that time, a value based on a tire coordinate system is used as the strain instead of X-Y-Z rectangular coordinate system.

Figure 5:
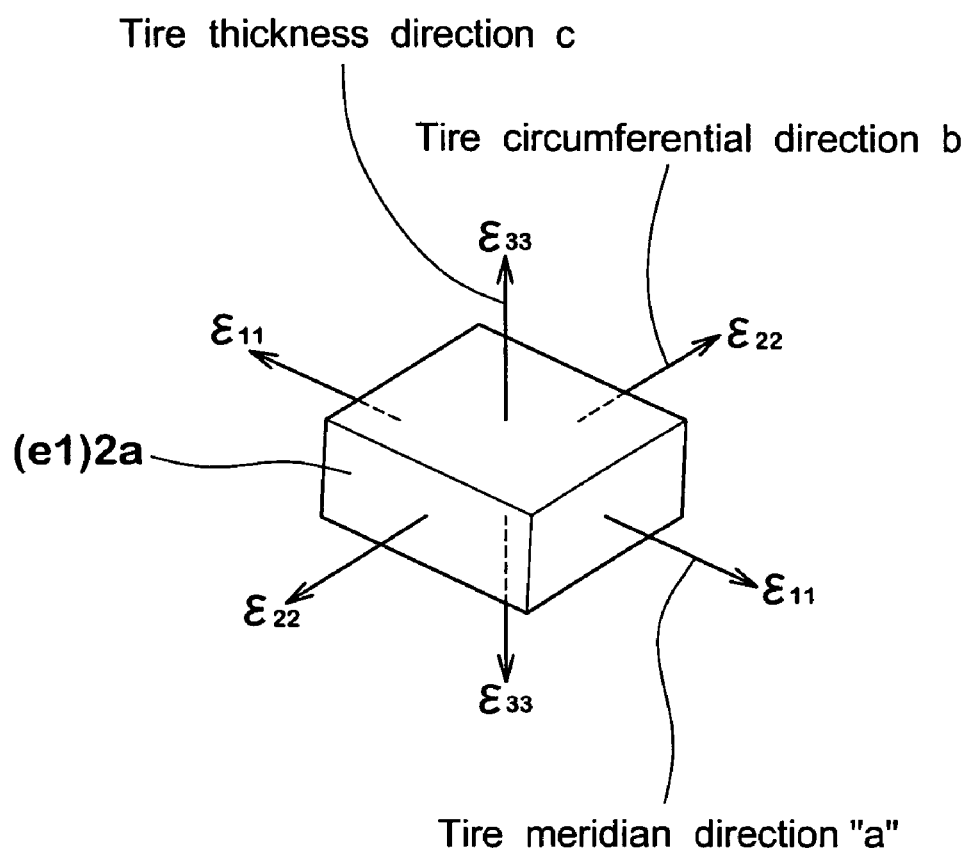
FIG. 5 is an enlarged perspective view of a first element used for explaining normal strains.
Figure 6A:
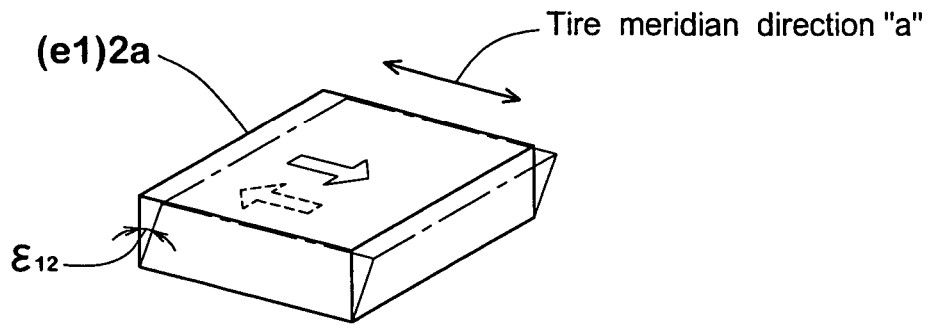
FIGS. 6 (A) to (C) are enlarged perspective views of the first element used for explaining shear strains.
Figure 6B:
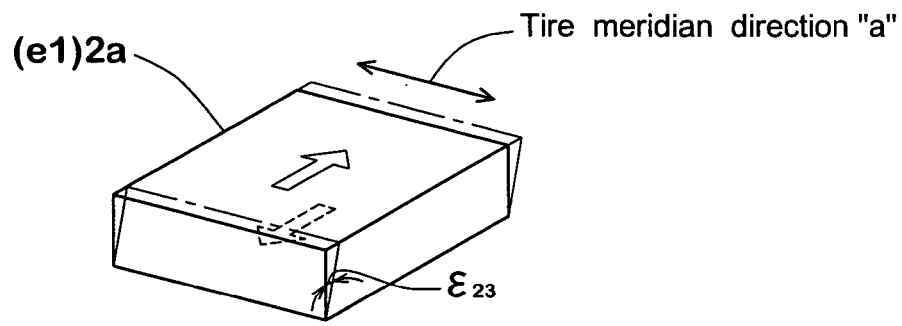
Figure 6C:
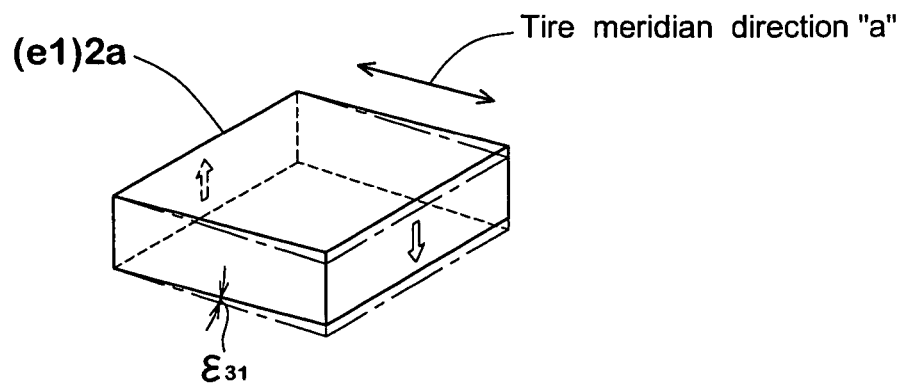

FIGS. 5 and 6 are enlarged view of an element 2a (that is the first element e1) shown in FIG. 4. As shown in FIGS. 5 and 6, the tire coordinate system is based on three directions, i.e., a tire meridian direction "a", a tire circumferential direction b and a tire thickness direction c. Concerning the first element e1 which is being simulated, the following six strain components are obtained:

strain $\epsilon_{11}$ along the tire meridian direction "a";
strain $\epsilon_{22}$ along the tire circumferential direction b;
strain $\epsilon_{33}$ along the tire thickness direction c;
shear strain $\epsilon 12$ along the tire meridian direction "a";
shear strain $\epsilon 23$ along the tire circumferential direction b; and shear strain ϵ31 along the tire thickness direction c.

Figure 7:
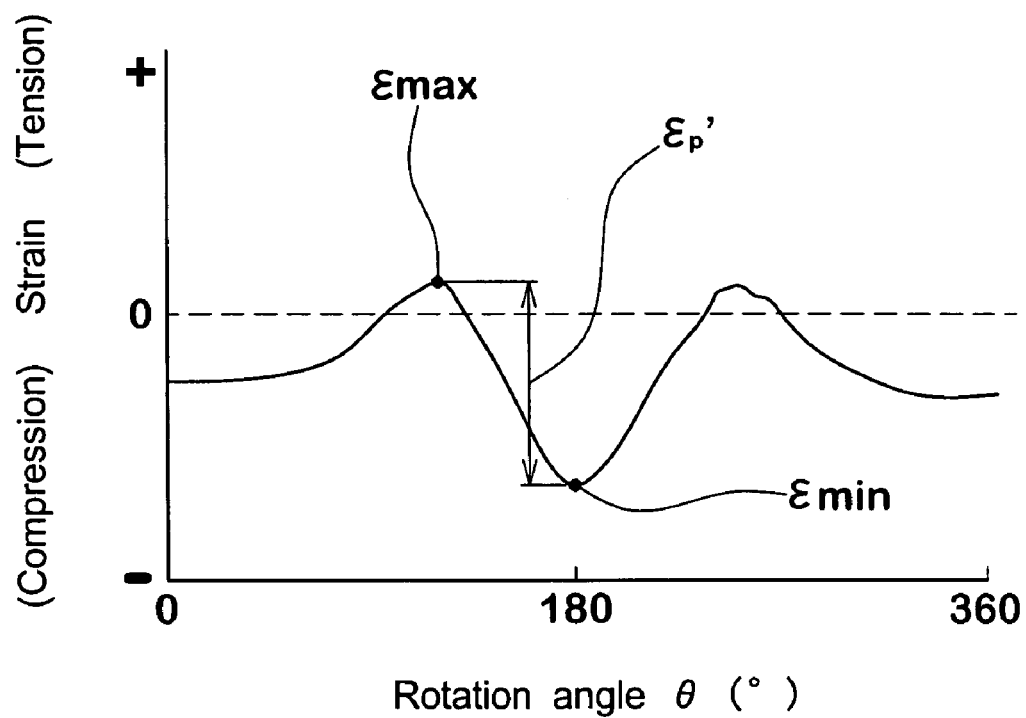
FIG. 7 is a graph showing hysteresis of normal strain of the first element.

FIG. 7 shows time series variation of strain (one of six components) of one first element e1 during one rotation of the tire model, i.e., hysteresis of strain. In the graph of FIG. 7, the horizontal axis shows a rotation angle of the tire model 2 and the vertical axis shows strain. The element of this example is located at a ground-contact center at a position where the rotation angle of the tire model 2 is 180°.

Figure 8:
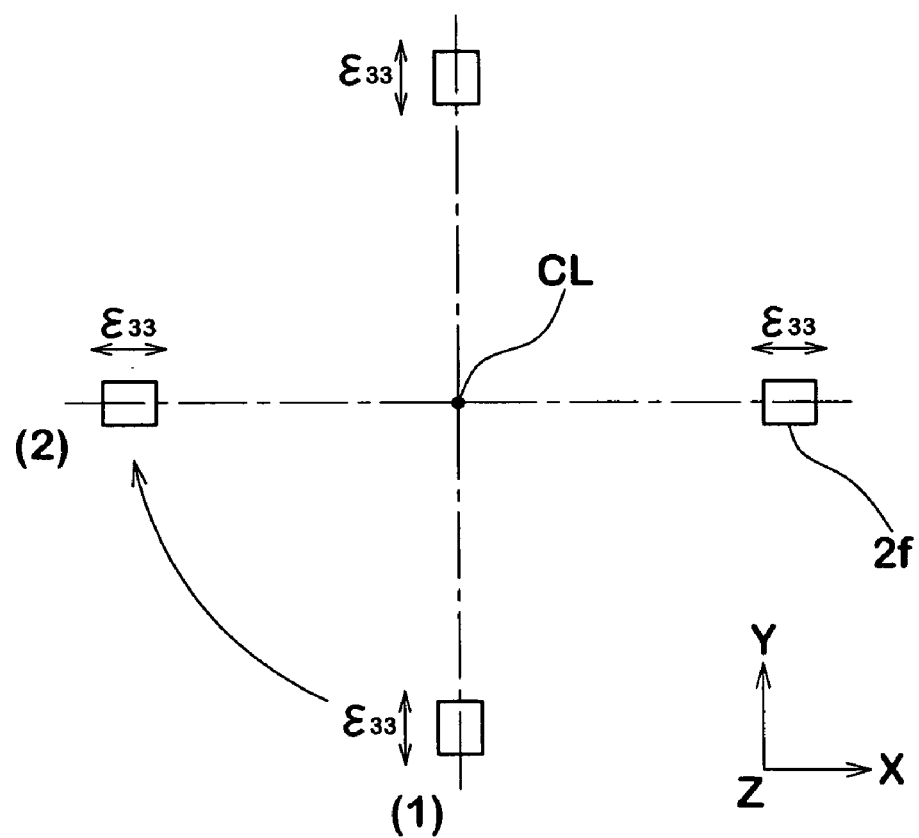
FIG. 8 is a diagram used for explaining an element in the entire coordinate system.

A merit obtained by using the strain of the tire coordinate system will be explained. FIG. 8 shows a case in which an element 2f of the tire model 2 idles around a tire axis CL which is perpendicular to a sheet of FIG. 8. If the internal pressure condition is given to the tire model 2, strain $\epsilon_{33}$ is generated in the element 2f in the tire thickness direction. In the X-Y-Z rectangular coordinate system, when the element 2f moves from a position (1) to a position (2), a strain state is waited as follows.

| Pos. (1): | X direction; 0, | Y direction; $\epsilon_{33}$ |
| Pos. (2): | X direction; $\epsilon_{33}$, | Y direction; 0 |

Since the element 2f is only idling, strain is not varied. However, if the rectangular coordinate system is used, strain in the X direction is varied from 0 to $\epsilon_{33}$, and strain in the Y direction is varied from $\epsilon_{33}$ to 0 in calculation. Thus, calculation error is generated. If strain of the tire coordinate system is used on the other hand, such inconvenience is not generated. That is, even if the element 2f idles from the position (1) to the position (2), the vertical strain $\epsilon_{33}$ in the tire thickness direction is not varied and the applied state is maintained. Thus, the precision of the simulation can be enhanced.

Next, energy loss of at least one first element e1 is calculated based on the six-component strains obtained by the simulation in this embodiment (step S4).

The energy loss has correlation with respect to the rolling resistance. Thus, it is possible to predict the rolling resistance also by comparing these values. To calculate the energy loss, a maximum amplitude ϵP' which is a difference between a maximum value $\epsilon_{max}$ and a minimum value $\epsilon_{min}$ of each six-component strain (six kinds of strains) is obtained from waveform of hysteresis of strain as shown in FIG. 7, and energy loss W per unit volume of the first model can also be calculated using the following equation (1):

$$W = \Sigma pi \cdot E \cdot (\epsilon_p'/2)^2 \cdot \tan \delta \quad (1)$$

wherein Σ represents a total sum of strains of the six components, E represents storage modulus of each first element, and tan δ represents loss tangent of the first element.

However, in this calculation method, since attention is paid only to the maximum amplitude $\epsilon_p'$, if two or more peaks are included in the waveform of the hysteresis of strain, energy loss is calculated smaller than the actual value, and there is a problem that the calculation precision is deteriorated.

In this embodiment, to solve such a problem, energy loss is calculated using the absolute value of the variation of strain, storage modulus E defined in the first element and the loss tangent tan δ for at least one first element. This will be explained concretely.

Figure 9A:
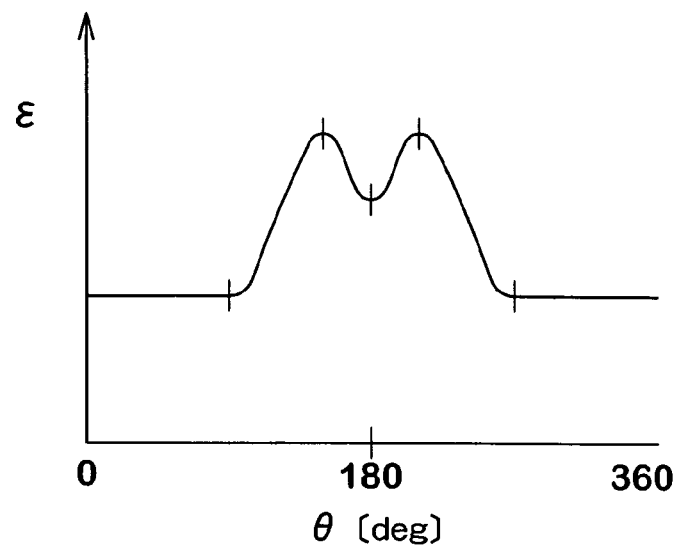
FIGS. 9 (A) to (C) are graphs used for explaining a strain path method.
Figure 9B:
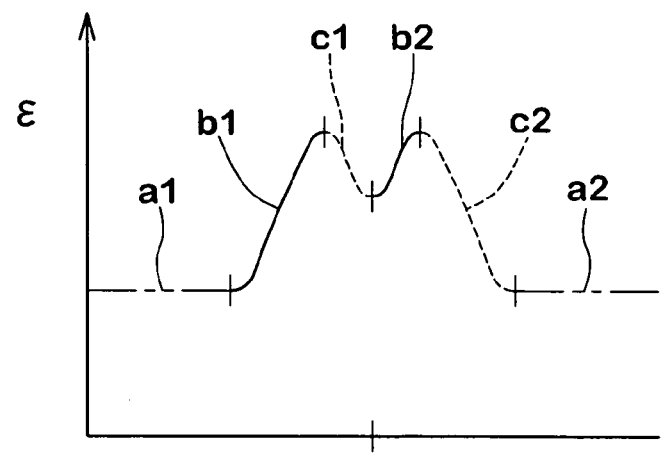
Figure 9C:
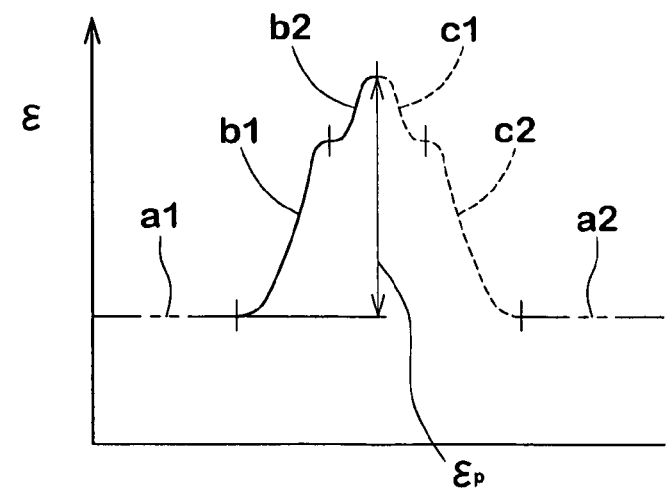

For example, hysteresis of strain as shown in FIG. 9(A) includes two peaks. AS shown in FIG. 9(B), the hysteresis of this strain is virtually divided into: a first flat region "a1"; a first increasing region b1; a first reducing region c1; a second increasing region b2; a second reducing region c2; and a second flat region "a2". As shown in FIG. 9(C), if the increasing regions b1 and b2, and reducing regions c1 and c2 are arranged in a different sequence such as the first flat region a1, the first increasing region b1, the second increasing region b2, the first reducing region c1, the second reducing region c2 and second flat region a2, it is possible to convert the regions into waveform having only one peak at the maximum amplitude $\epsilon_p$.

Figure 10:
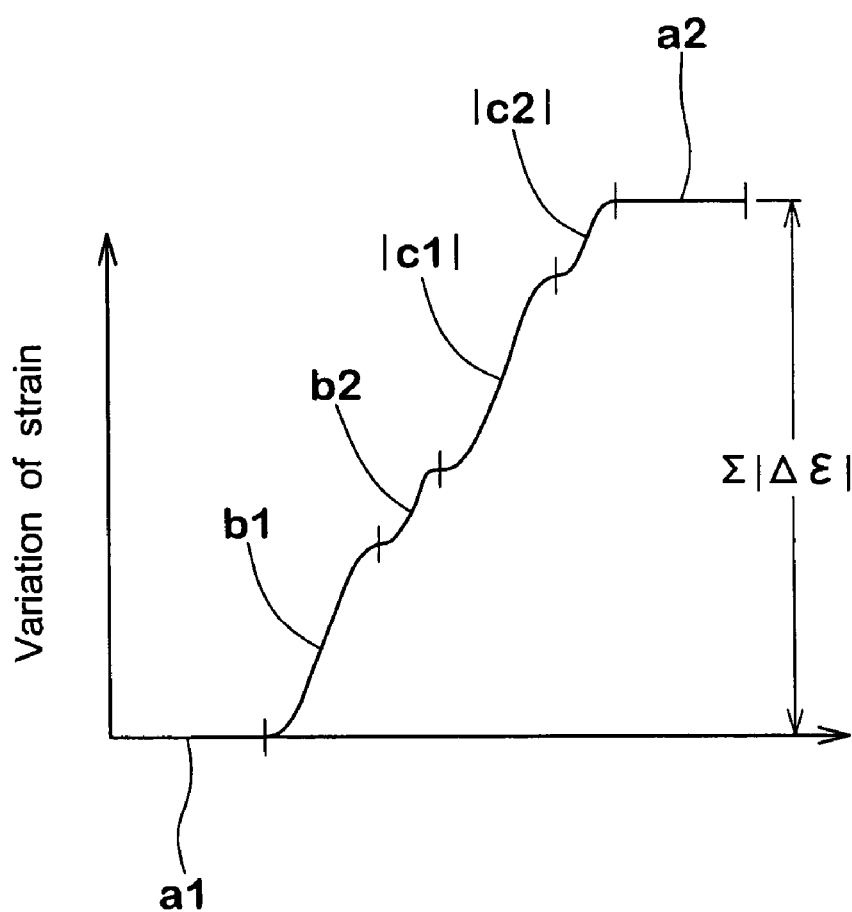
FIG. 10 is a graph showing a conception of an accumulated value of absolute values of variation of strain.

By accumulating the absolute values of the variation of strains, $\Sigma|\Delta\epsilon|$ can be obtained as shown in FIG. 10. Here, since increment and decrement of strain are the same in the one rotation of the tire, a half of the accumulated value $\Sigma|\Delta\epsilon|$ corresponds to $\epsilon_p$ in FIG. 9(C). According to this calculation method, even if the hysteresis of strain includes plurality of peaks, influence is not caused by the number of the peaks.

In the above-described method, the accumulated value $\epsilon_p$ of each strain is calculated using the following equation (2):

$$\epsilon_p = \{\Sigma|\epsilon_{i+1} - \epsilon_i|\}/2 \quad (2)$$

wherein i=1 to n.

Further, Σ represents a total sum of strains of the six components, $\epsilon_i$ represents each strain of the first element at arbitrary time, and $\epsilon_{i+1}$ represents strain of the first element when preset very short time is elapsed after the former time. Further, energy loss W per unit volume of the first element can be calculated using the following equation (3):

$$W = \Sigma pi \cdot E \cdot (\epsilon_p/2)^2 \cdot \tan \delta \quad (3)$$

wherein Σ represents a total sum of strains of the six components, E represents storage modulus defined in the first element, $\epsilon_p$ represents the accumulated value, and tan δ represents loss tangent defined in the first element.

Using the energy loss W, rolling resistance RRC representing of the tire performance is calculated approximately. The rolling resistance RRC is obtained by dividing energy loss while the tire model 2 is rolling by the rolling distance. The following equation (4) is for calculating the rolling resistance RRC during one rotation of the tire model 2. Here, air resistance is not included in the rolling resistance of a pneumatic tire.

$$RRC = \{\Sigma(W \cdot V)\}/(2 \cdot pi \cdot R) \quad (4)$$

wherein V represents volume of the first element, R represents radius of load and Σ represent a total sum of all of the first elements.

According to the present invention, energy loss of a tire model 2 in which the cross section is not continuous in the tire circumferential direction can precisely be calculated using the dynamic analysis. Since the energy loss is calculated using the strains of six components based on the tire coordinate system, the calculation precision is extremely high. Especially as in this embodiment, if the absolute value of the variation amount of strain is used, energy loss can be calculated without influence of waveform of hysteresis of strain.

Figure 11:
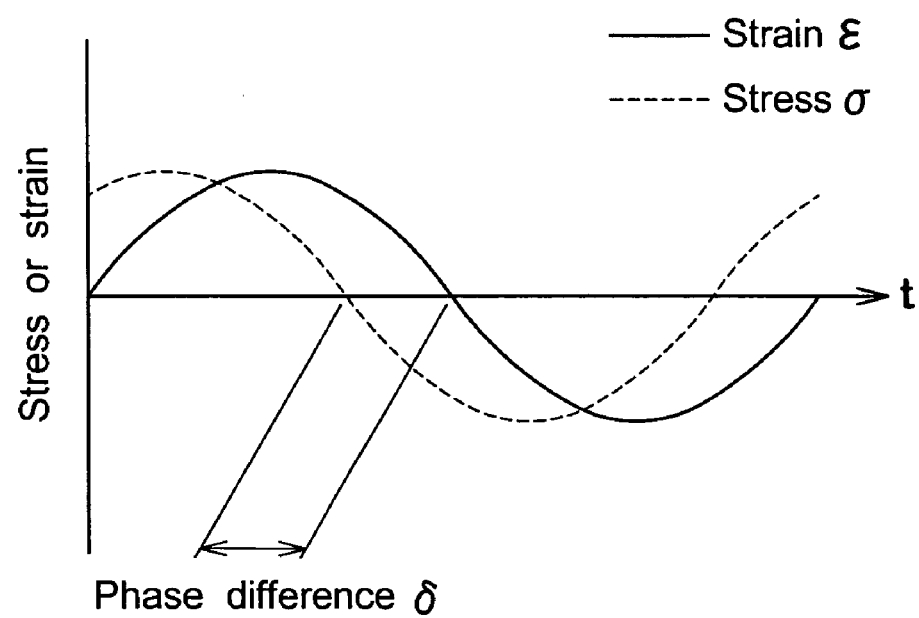
FIG. 11 is a graph showing hysteresis of stress and strain for explaining energy loss.

FIGS. 11 and 12 show another embodiment for calculating energy loss of the first element of the tire model 2. In this embodiment, for at least one first element e1 of the tire model 2, the energy loss is calculated based on the hysteresis of the strain and the damping property which is previously defined for the element e1.

Figure 12A:
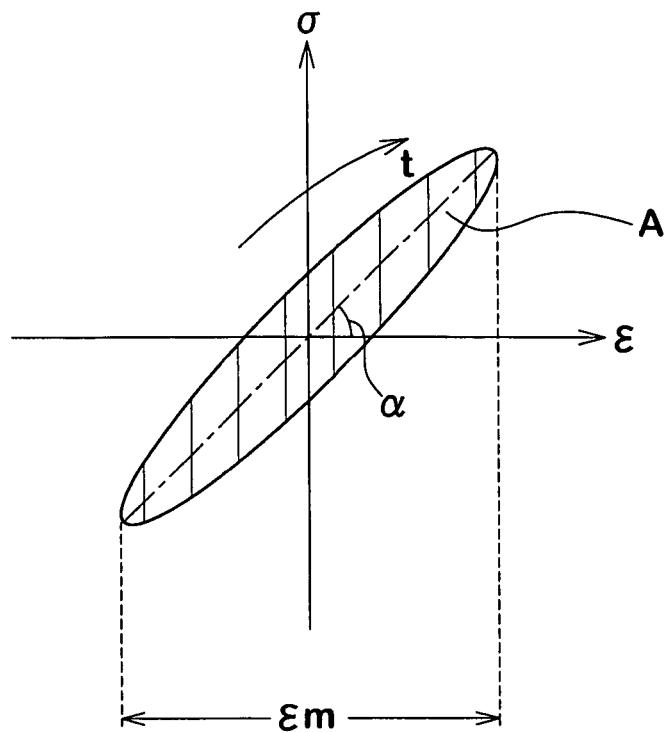
FIGS. 12(A) is a graph used for explaining a hysteresis loop and (B) is a graph used for explaining damping properties.

FIG. 11 shows a relation between periodic stress and strain for the first element. The strain of the first element having viscoelastic property has a phase difference δ with respect to stress. FIG. 12(A) shows a result of measurement of the actual viscoelasticity of rubber material to be modeled of the first element. In FIG. 12(A), the vertical axis shows stress σ, and the horizontal axis shows strain ϵ. The viscoelastic property of the rubber material applies strain amplitude of constant frequency to a test piece, and stress generated at that time is measured by viscoelastic spectrum tester.

Figure 12B:
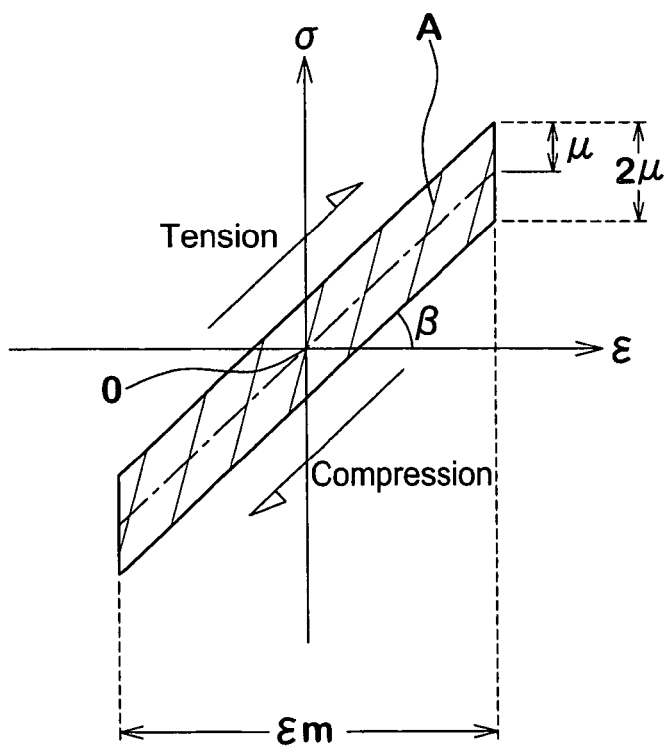

The damping property is defined based on a hysteresis loop obtained as a result of the viscoelastic property test. FIG. 12(B) shows one example of the damping property defined in an arbitrary first element. In this specification, the damping property $\mu$ can be obtained by dividing an area "A" of the hysteresis loop by a value of two times of the strain amplitude $\epsilon_m$ used in the viscoelastic properties test ($\mu=A/\{2|\epsilon_m|\}$). FIG. 12(B) shows a parallelogram graph in a coordinate system in which the vertical axis shows stress $\sigma$ and the horizontal axis shows strain $\epsilon$. An area surrounded by the parallelogram is equal to the area "A" of the hysteresis loop, and the strain amplitude of the strain is equal to the strain amplitude $\epsilon_m$ shown in FIG. 12(A). At that time, the length $2\mu$ of a vertical line segment of the parallelogram is defined as the damping property $\mu$. That is the damping property $\mu$ is energy loss per unit strain variation in one direction like the tensile strain or compression strain.

In this embodiment, the energy loss W is calculated by multiplying the absolute value of the variation of strain of the first element e1 by the damping properties $\mu$, and accumulating the damping property for one turn of the tire model as shown in the following equation (5):

$$W=\Sigma(\mu \cdot |\epsilon_{i+1}-\epsilon_i|) \quad (5)$$

wherein W represents energy loss per unit volume of the first element, $\Sigma$ represents a total sum of strains of the six components, $\mu$ represents damping property, $\epsilon_i$ represents strain of the first element at arbitrary time, $\epsilon_{i+1}$ represents strain of the first element when predetermined very short time is elapsed after the former time, and $\Sigma$ represents a sum of all of elements and six components of the strains.

Originally, a diagram of strain-stress having no damping is one proportional straight line passing through an origin, tension and compression pass through the same path. In this embodiment, when an elastic body is deformed, friction resistance (friction damping) is added, and this is conceived as a parallelogram loop in which tension has increased stress of damping properties and compression has reduced stress of damping properties as shown in FIG. 12(B).

In the parallelogram loop for determining the damping property $\mu$ of the embodiment, an inclination angle $\beta$ which is inclination of a hypotenuse is set equal to an inclination angle $\alpha$ of a long axis of an ellipse of the hysteresis loop. By calculating the energy loss based on the equation (5) using such damping properties $\mu$, even if the strain variation of one turn of the tire is complicated and it has the plurality of peaks as in the embodiment, a precise result can be obtained.

As explained above, according to the method of simulation of a tire according to the present invention, the cross section and material properties of the tire model 2 need not be continuous in the circumferential direction of the tire, and the energy loss of the tire model 2 which is not uniform in the tire circumferential direction can be calculated. Therefore, a rubber material or a joint portion such as a ply can be incorporated in the tire model 2 and their influences can be checked.

It is unnecessary to calculate energy loss for all of the first elements e1 of the tire model 2, and it is possible to calculate and evaluate the energy loss only for a specific rubber (e.g., tread rubber, sidewall rubber or cushion rubber).

Comparison Test:

The rolling resistance RRC was calculated in accordance with the simulation method of the present invention for each of three kinds of pneumatic radial tires for passenger car having tire size of 195/65R15. The following tires were employed. Internal structures of the tires are the same, and only tread patterns are different as follows.

(Tire 1)

Three straight grooves extending in the tire circumferential direction are provided on the tread portion, but no lateral groove is provided.

(Tire 2)

Three straight grooves extending in the tire circumferential direction and 60 lateral grooves (arranged at equal distances from one another) extending in the tire axial direction are provided on the tread portion.

(Tire 3)

Three straight grooves extending in the tire circumferential direction and 50 lateral grooves (arranged at equal distances from one another) extending in the tire axial direction are provided on the tread portion.

Figure 13:
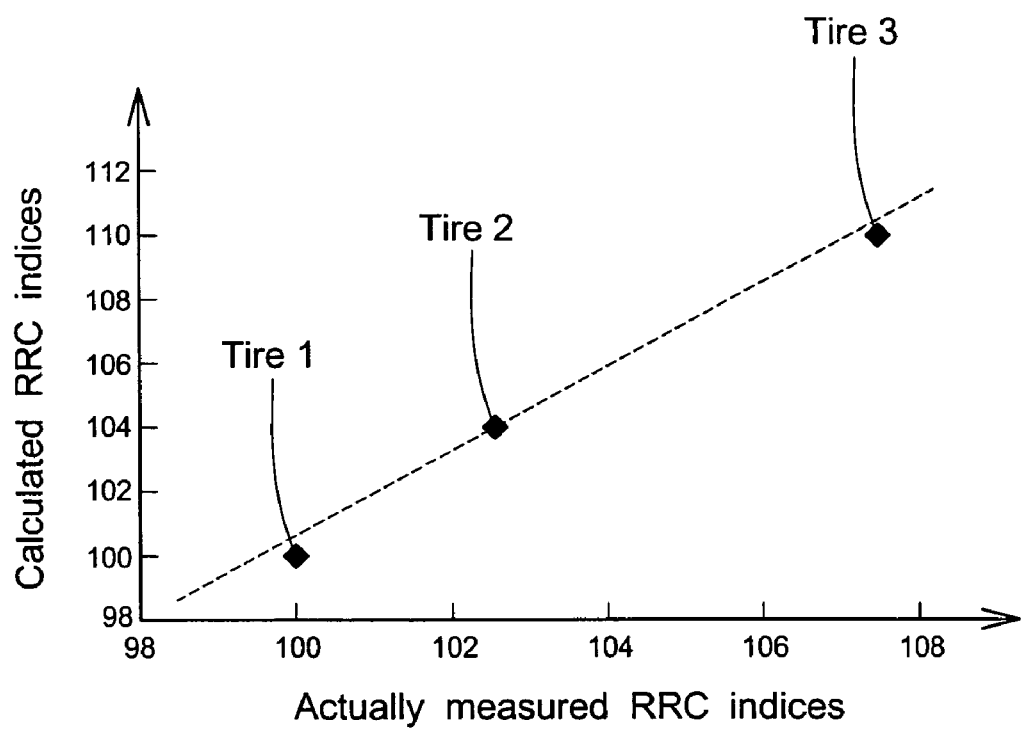
FIG. 13 is a graph showing a comparison between actually measured rolling resistance indices and calculated rolling resistance indices.
Figure 14A:
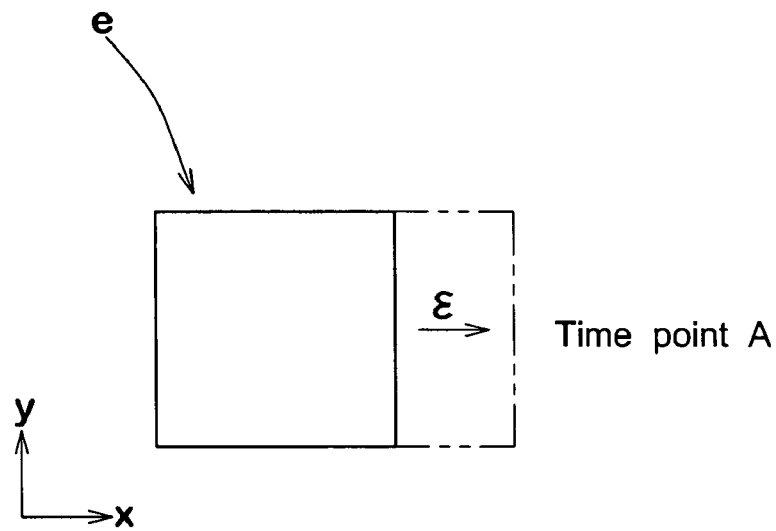
FIGS. 14 (A) and (B) are diagrams used for explaining strain of an element.
Figure 14B:
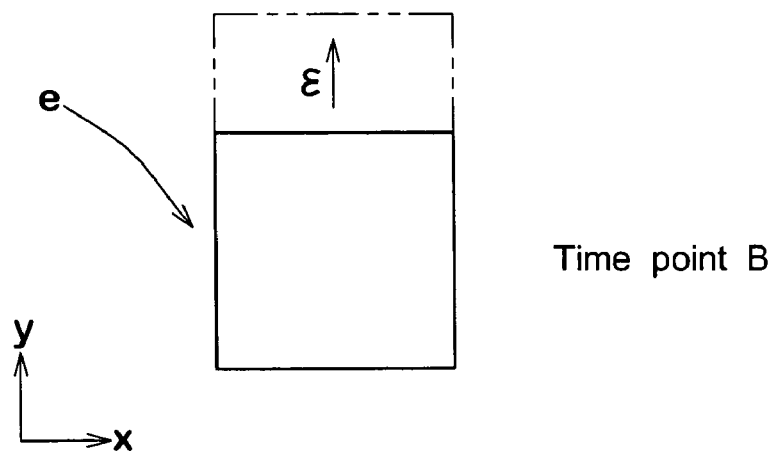

In this test, the energy loss was calculated using the equation (5). For comparison, rolling resistance was measured by a rolling resistance tester using the actual tire having the same size and same structure, and a correlation therebetween was checked. Simulation and test conditions are a camber angle of 0°, vertical load of 4.5 kN, and test speed of 80 km/H. FIG. 13 shows a result of the test and the like. As apparent from FIG. 13, a strong correlation is found between the actually measured rolling resistance index and the calculated rolling resistance index (rolling resistance of the tire 1 is set to 100 as index), and it can be confirmed that the precision of the simulation is excellent.

The invention claimed is:

1. A method of simulating rolling tire comprising the steps of:

modeling the tire in finite elements to make a tire model which comprises at least one first element having a viscoelastic property;

modeling a road in finite elements to make a road model;

executing a numerical simulation in which the tire model is made to roll on the road model at a predetermined condition;

obtaining six kinds of strains in time sequence from the first element of the tire model rolling on the road model, the six kinds of strains including three kinds of normal strains along a tire meridian direction, a tire circumferential direction and a tire thickness direction, and three kinds of shear strain along the tire meridian direction, the tire circumferential direction and the tire thickness direction; and calculating energy loss of the first element based on the six kinds of the strains.

2. The method of simulating rolling tire according to claim 1, wherein a meridian cross section including a tire axis of the tire model is not continuous in the circumferential direction of the tire.

3. The method of simulating rolling tire according to claim 1, wherein at least one material property of the tire model is not continuous in the circumferential direction of the tire.

4. The method of simulating rolling tire according to claim 1, wherein the energy loss is calculated using:

an accumulated value obtained by accumulating absolute values of variation of each said six kinds of strains of the first element through one rotation of the tire model;

storage modulus predetermined for the first element; and loss tangent predetermined for the first element.

5. The method of simulating rolling tire according to claim 4, wherein the energy loss is calculated by the following equation:

$$W = \Sigma pi \cdot E(\epsilon_p/2)^2 \cdot \tan \delta$$

wherein

W represents energy loss per unit volume of the first element,

E represents the storage modulus defined for the first element, $\epsilon_p$ represents the accumulated value, $\Sigma$ represents a total sum of said six kinds of strains and $\tan \delta$ represents the loss tangent defined for the first element.

6. The method of simulating rolling tire according to claim 1, wherein the energy loss is calculated by the following equation:

$$W = \Sigma(\mu \cdot |\epsilon_{i+1} - \epsilon_i|)$$

wherein

W represents the energy loss per unit volume of the first element, $\Sigma$ represents a total sum of said six kinds of strains, $\mu$ represents damping properties defined for the first element, $\epsilon_i$ represents strain of the first element at an arbitrary time, and $\epsilon_{i+1}$ represents strain of the first element when a preset very short time is elapsed after former time.

* * * * *